United States Patent
Yamamoto et al.

(10) Patent No.: US 9,376,748 B2
(45) Date of Patent: Jun. 28, 2016

(54) METHOD FOR ETCHING ORGANIC FILM

(71) Applicant: AICHI STEEL CORPORATION, Tokai-shi (JP)

(72) Inventors: Michiharu Yamamoto, Aichi (JP); Shunichi Tatematsu, Aichi (JP); Ryusuke Yamashita, Aichi (JP); Norihiko Hamada, Aichi (JP); Koei Gemba, Aichi (JP)

(73) Assignee: AICHI STEEL CORPORATION, Tokai-shi (JP)

( * ) Notice: Subject to any disclaimer, the term of this patent is extended or adjusted under 35 U.S.C. 154(b) by 0 days.

(21) Appl. No.: 14/625,048

(22) Filed: Feb. 18, 2015

(65) Prior Publication Data

US 2015/0232984 A1    Aug. 20, 2015

(30) Foreign Application Priority Data

Feb. 19, 2014    (JP) .................... 2014-029708

(51) Int. Cl.
| | |
|---|---|
| *B44C 1/22* | (2006.01) |
| *C23C 16/04* | (2006.01) |
| *C23C 16/44* | (2006.01) |
| *C23C 16/40* | (2006.01) |
| *H01F 41/04* | (2006.01) |

(52) U.S. Cl.
CPC ............. *C23C 16/045* (2013.01); *C23C 16/401* (2013.01); *C23C 16/44* (2013.01); *H01F 41/04* (2013.01)

(58) Field of Classification Search
CPC ... H01L 21/3065; H01L 21/768; H01L 21/28; C23C 16/045; C23C 16/401; H01F 41/04
USPC .......................... 216/12, 37, 67; 438/690–695
See application file for complete search history.

(56) References Cited

U.S. PATENT DOCUMENTS

| | | | |
|---|---|---|---|
| 7,205,226 B1* | 4/2007 | Schaefer | H01L 21/30655 257/E21.017 |
| 7,759,239 B1 | 7/2010 | Lin et al. | |
| 8,461,834 B2* | 6/2013 | Honkura | G01R 33/0052 257/427 |
| 8,872,350 B2* | 10/2014 | Sawachi | H01L 24/24 257/678 |
| 2009/0286400 A1 | 11/2009 | Heo et al. | |
| 2013/0186858 A1* | 7/2013 | Suzuki | H01J 37/32623 216/67 |

FOREIGN PATENT DOCUMENTS

JP    2005 79192    3/2005

OTHER PUBLICATIONS

Extended Search Report issued Jun. 16, 2015 in European Patent Application No. 15154874.0.

* cited by examiner

*Primary Examiner* — Duy Deo
*Assistant Examiner* — Maki Angadi
(74) *Attorney, Agent, or Firm* — Oblon, McClelland, Maier & Neustadt, L.L.P.

(57) ABSTRACT

A method for etching an organic film 1 having a surface selectively protected by a hard mask layer 2, includes a partial etching process of etching the organic film 1 partly in a thickness direction of the organic film 1 by using a mixed gas containing a gas that anisotropically etches a silicon oxide film and a gas that isotropically etches the organic film without etching the silicon oxide film; and a deposition process of depositing a protective film 3 made of the silicon oxide film on side surfaces 12 and a bottom surface 11 of a recess 10 formed in the organic film in the partial etching process. The partial etching process and the deposition process is alternately performed multiple times.

6 Claims, 14 Drawing Sheets

METHOD FOR ETCHING ORGANIC FILM

CROSS-REFERENCE

This application claims priority to Japanese patent application No. 2014-029708 filed on Feb. 19, 2014, the contents of which are entirely incorporated herein by reference.

BACKGROUND OF THE INVENTION

1. Field of the Invention

The present invention relates to a method for selectively etching an organic film for a plating resist and so on.

2. Description of the Background Art

In the course of manufacturing electronic components or the like, a process of applying an organic film such as a plating resist to a substrate and selectively etching the organic film may be performed. In this process, the surface of the organic film is partially protected by a hard mask layer made of $SiO_2$ or the like, and thereafter, dry etching is performed to remove portions of the organic film which are exposed from the hard mask.

As an example of the organic film etching method, a method of isotropically etching an organic film by using oxygen radicals has been known. This method is characterized by its high etching rate for the organic film.

As another method, a method of anisotropically etching an organic film by using an etching gas obtained by mixing CH-based gas and $NH_3$ gas has been known (JP-A-2005-79192). In this method, during the etching, the organic film and the etching gas chemically react with each other to form a protective film on side surfaces of the organic film. Therefore, the etching can be performed with the side surfaces being protected, and thereby the pattern of the hard mask layer can be accurately transferred onto the organic film.

However, the etching method using oxygen radicals has the following drawback. That is, since this etching is isotropic etching although the etching rate is high, if, for example, the organic film is thick, it is difficult to accurately transfer the pattern of the hard mask layer onto the organic film. For example, when a wiring pattern is formed on a substrate having a large height difference of several µm or more, the thickness of the organic film (plating resist) needs to be increased. Since the isotropic etching advances also on side walls, if the organic film is thick, it is difficult to accurately transfer the pattern of the hard mask layer onto the organic film. In particular, when a fine wiring pattern needs to be formed on the thick organic film, it is difficult for the isotropic etching to accurately transfer the fine pattern of the hard mask layer onto the organic film.

In addition, the method of anisotropically etching an organic film by using the etching gas obtained by mixing CH-based gas and $NH_3$ gas allows accurate transfer of the pattern of the hard mask layer onto the organic film. However, this etching method has the following drawback. That is, when the thickness of the organic film needs to be increased as described above, the etching takes a long time since the etching rate is low. Therefore, these etching gases are hard to be used.

The present invention has been made in view of the above background, and provides a method for etching an organic film which allows accurate transfer of the pattern of a hard mask layer at a high etching rate, which enables etching in a short time, even in etching of a thick organic film as in the case of etching an organic film formed on a substrate having a large height difference.

SUMMARY OF THE INVENTION

One aspect of the present invention provides a method for etching an organic film having a surface selectively protected by a hard mask layer, the method including:
a partial etching process of etching the organic film partly in a thickness direction of the organic film by using a mixed gas containing a gas that anisotropically etches a silicon oxide film and a gas that isotropically etches the organic film without etching the silicon oxide film; and
a deposition process of depositing a protective film made of the silicon oxide film on side surfaces and a bottom surface of a recess formed in the organic film in the partial etching process,
the partial etching process and the deposition process being alternately performed multiple times.

In the aforesaid method for etching the organic film, the partial etching process and the deposition process are alternately performed multiple times. By so doing, etching can be performed in the organic film from the surface to a deeper position without greatly changing the etching pattern. Therefore, even in the case of etching a thick organic film as in the case of etching an organic film formed on a substrate having a large height difference, the pattern of the hard mask layer can be accurately transferred onto the organic film, and the etching rate can be increased.

That is, since the mixed gas includes the gas that anisotropically etches the silicon oxide film (protective film), when the partial etching process is performed using the mixed gas, the protective films formed on the side surfaces of the recess in the last deposition process are not largely etched but the protective film formed at the bottom surface is mainly etched so as to expose the organic film at the bottom surface of the recess. And in the subsequent partial etching process, the organic film exposed at the bottom surface can be etched by the gas which is included in the mixed gas and isotropically etches the organic film without etching the silicon oxide film (protective film).

By alternately repeating the partial etching process and the deposition process, the organic film can be etched in the thickness direction while the side surfaces are protected by the protective films. In a portion of the organic film to be newly etched by the isotropic etching gas, etching advances also on the side surfaces of the portion. However, by appropriately controlling the amount of etching in the thickness direction, the amount of etching at the side surfaces can be suppressed to a negligible amount. Further, since the protective film is formed in the subsequent deposition process, the side surfaces can be protected by the protective film in the partial etching process that follows the deposition process, whereby the side surfaces are prevented from being largely etched. Thereby, anisotropy of etching can be enhanced, and the pattern of the hard mask layer can be accurately transferred onto the organic film. Since the etching rate of the isotropic etching gas is higher than that of the above-mentioned mixed gas of CH-based gas and $NH_3$ gas, even when the partial etching process and the deposition process are alternately performed, the etching rate throughout the whole process can be made relatively high.

As described above, according to the present invention, it is possible to provide an organic film etching method which allows accurate transfer of the pattern of the hard mask layer, and has a high etching rate.

DESCRIPTION OF THE PREFERRED EMBODIMENTS

Figure 1:
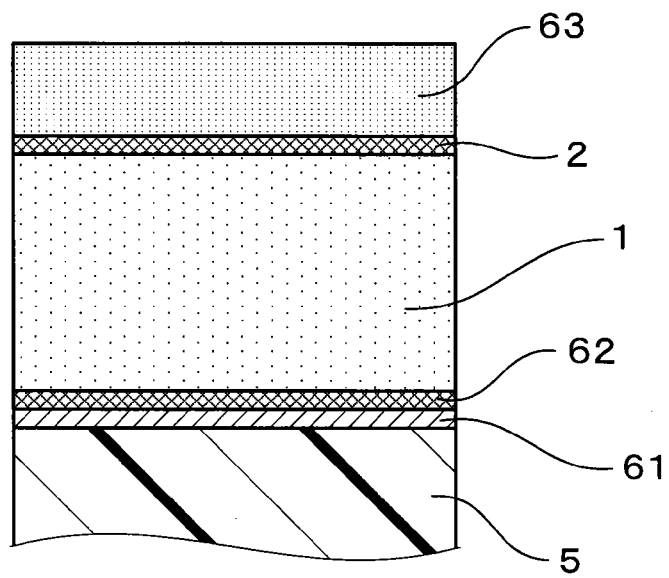
FIG. 1 is a cross-sectional view illustrating a plating method using an organic film etching method according to Example 1.

In the aforesaid method for etching the organic film, it is preferable that the mixed gas contains $O_2$ gas and Ar gas, and $Ar^+$ and oxygen radicals are generated from the mixed gas in the partial etching process, and that the $Ar^+$ anisotropically etches the silicon oxide film, and the oxygen radicals isotropically etch the organic film.

When the $Ar^+$ converted from the Ar gas is applied to the organic film, the $Ar^+$ activates the organic film at the bottom surface to enhance the reactivity. When the Ar gas is used in combination with the $O_2$ gas, the etching rate can be increased much more effectively as compared with the case where the $O_2$ gas is solely used. Further, when the oxygen radicals are used, the etching rate of the organic film by the isotropic etching can be particularly increased.

It is preferable that the organic film is a plating resist for forming a wiring layer having a height difference in the thickness direction of the organic film.

In order to form, by plating, a wiring layer having a height difference in its thickness direction, a thick plating resist (organic film) needs to be used. In such a case as the plating resist (organic film) is thick, the above-mentioned etching method having such a high etching rate can complete the etching in a short time. Further, as described above, the etching method allows accurate transfer of the pattern of the hard mask layer from the surface of the organic film to a deeper position in the organic film without greatly changing the pattern of the hard mask layer. Therefore, even when the organic film is thick, it is possible to easily form a wiring layer having a small width.

Further, it is preferable that the wiring layer forms a coil that winds around a magneto-sensitive body provided on a substrate in an MI sensor, and that the organic film is a plating resist for forming the coil.

The detection coil of the MI sensor needs to be formed extending over a large protrusion formed by the magneto-sensitive body or the substrate. Therefore, in order to bury the height difference formed by the protrusion, the plating resist (organic film) for forming the detection coil particularly needs to be thick. Further, in recent years, demands for size reduction and high sensitivity of the MI sensor have been increased, and accordingly, it has become more necessary to enhance the sensitivity by reducing the width of the detection coil and increasing the number of turns thereof. This is because the output power of the detection coil can be increased by reducing the width thereof and increasing the number of turns thereof. Thus, the plating resist (organic film) for the coil of the MI sensor needs to have a large thickness and a narrow width, and therefore, a method allowing accurate pattern transfer at a high etching rate, like the above-mentioned etching method, produces a great advantageous effects. In the MI sensor, besides the detection coil, a coil for applying a bias magnetic field or a feedback coil may be formed. Also in this case, the present invention can be similarly applied.

The present invention is also applicable to a case where a coil other than the coil of the MI sensor is formed. In order to form, by plating, a coil having a fine pattern and extending over a large protrusion, a plating resist (organic film) needs to have a large thickness and reduced width. Therefore, the use of the present invention produces great advantageous effects.

EXAMPLES

Example 1

An example of the above-mentioned method for etching an organic film will be described with reference to FIGS. 1 to 13. As shown in FIGS. 4 to 10, in the etching method according to the present example, an organic film 1 whose surface is selectively protected by a hard mask layer 2 is subjected to etching. In the present example, a partial etching process (refer to FIGS. 7 to 9) and a deposition process (refer to FIG. 6) are repeatedly performed.

Figure 7:
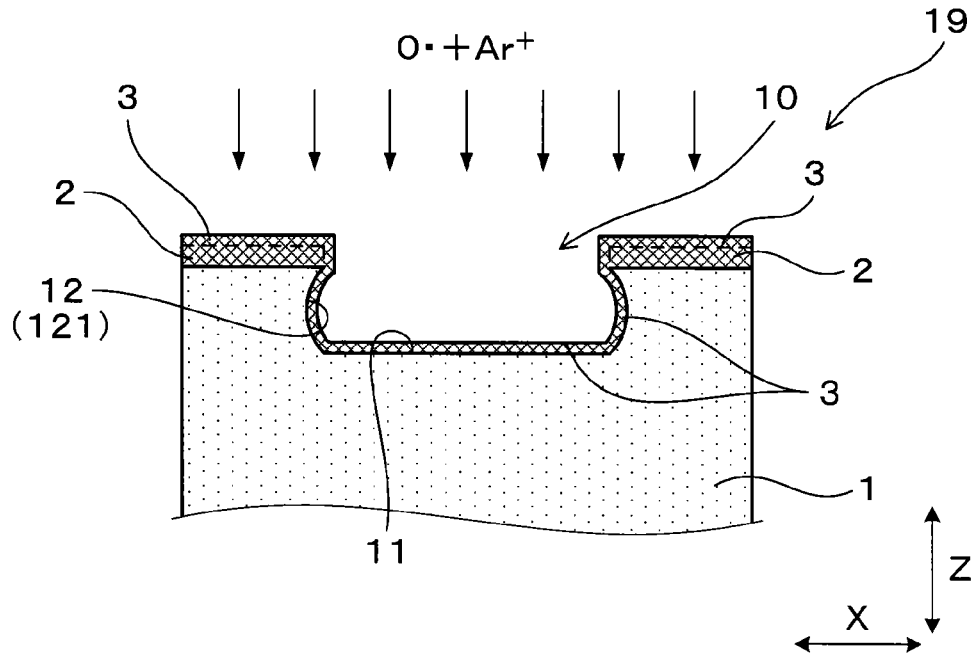
FIG. 7 is a major part enlarged view that follows FIG. 6, illustrating the partial etching process.
Figure 8:
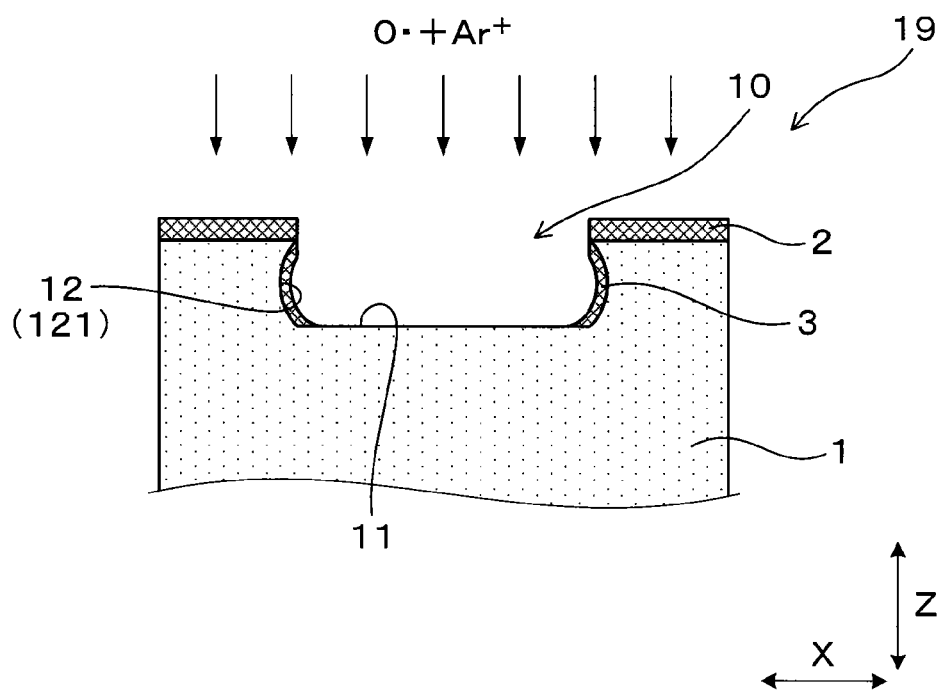
FIG. 8 is a major part enlarged view that follows FIG. 7, illustrating the partial etching process.
Figure 9:
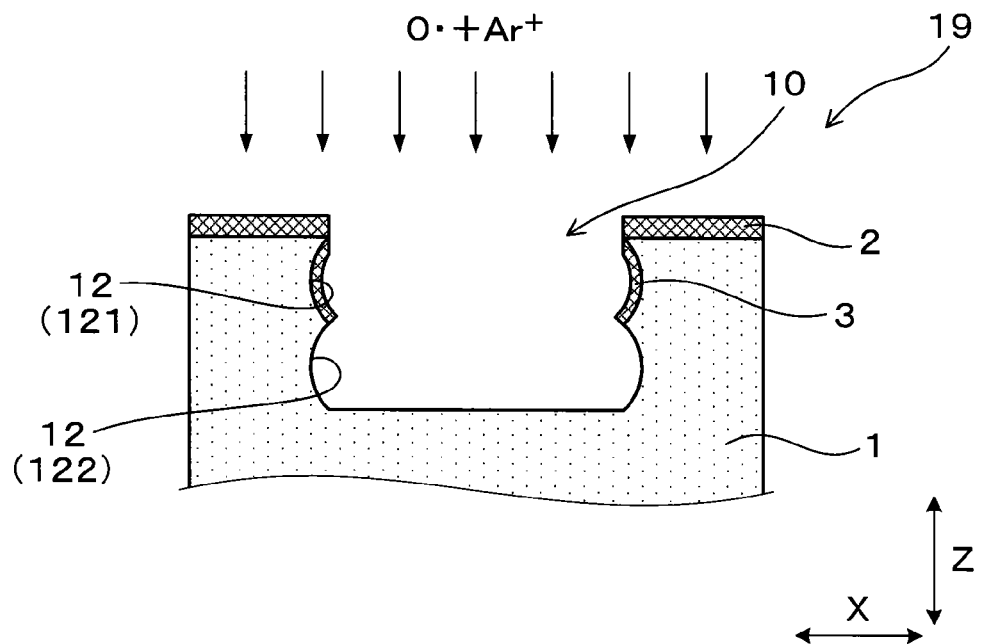
FIG. 9 is a major part enlarged view that follows FIG. 8, illustrating the partial etching process.

As shown in FIGS. 7 to 9, in the partial etching process, the organic film 1 is etched partly in its thickness direction by using a mixed gas containing a gas that anisotropically etches a silicon oxide film and a gas that isotropically etches the organic film 1 without etching the silicon oxide film.

Figure 6:
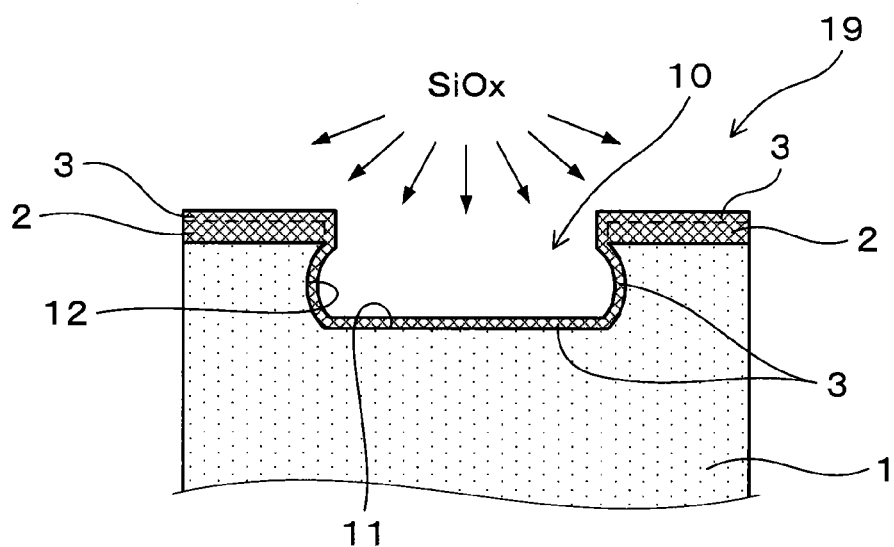
FIG. 6 is a major part enlarged view that follows FIG. 5, illustrating a deposition process.

As shown in FIG. 6, in the deposition process, a protective film 3 made of a silicon oxide film is grown on side surfaces 12 and a bottom surface 11 of a recess 10 formed in the organic film 1 in the partial etching process.

The organic film 1 according to the present example is a plating resist for forming a wiring layer 7 of an electronic component. Hereinafter, a plating method using the etching method of the present example will be described.

Figure 12:
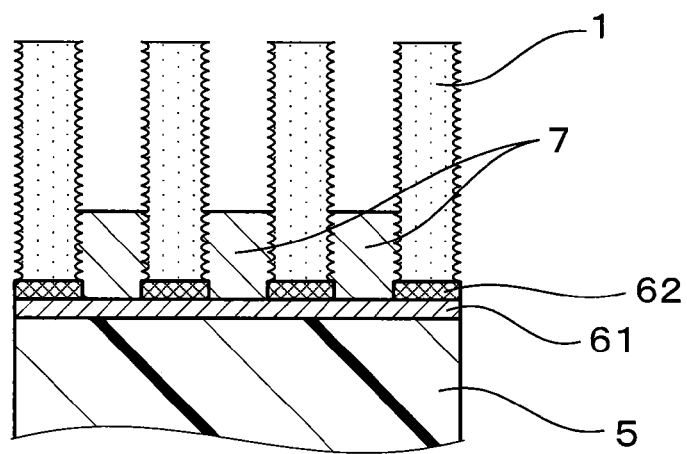
FIG. 12 is a cross-sectional view that follows FIG. 11.

In the present example, a substrate 5 (refer to FIG. 13) has a large protrusion (not shown), and the wiring layer 7 is formed extending over the protrusion. In order to form the wiring layer 7 by plating, a thick plating resist (organic film 1:

refer to FIG. 12) needs to be used. In attempt to directly expose such a thick plating resist (organic film 1) with an exposure device, the exposure device cannot focus on the plating resist. Therefore, as shown in FIG. 1, a hard mask layer 2 and a photoresist 63 are formed on the organic film 1, and the photoresist 63 and the hard mask layer 2 are first patterned (refer to FIGS. 2 to 4) and then the organic film 1 is etched (refer to FIGS. 5 to 10) to transfer the pattern of the hard mask layer 2 onto the organic film 1. Hereinafter, the plating method of the present example will be described in detail.

First, as shown in FIG. 1, on the substrate 5 made of silicon, a seed layer 61, a seed protective layer 62, the organic film 1, the hard mask layer 2, and the photoresist 63 are formed in order. The seed layer 61 is a layer that acts as a nucleus for plating growth in a plating process described later. As the seed layer 61, for example, Cu may be used. The seed protective layer 62 is a layer for protecting the seed layer 61 when the organic film 1 is etched. As the seed protective layer 62, for example, a silicon oxide film may be used.

The organic film 1 is a plating resist used when the later-described plating process (refer to FIGS. 12 and 13) is performed. As the organic film 1, for example, an epoxy resin may be adopted. The hard mask layer 2 is a layer for forming a pattern for etching the organic film 1. For example, a silicon oxide film may be used.

Figure 2:
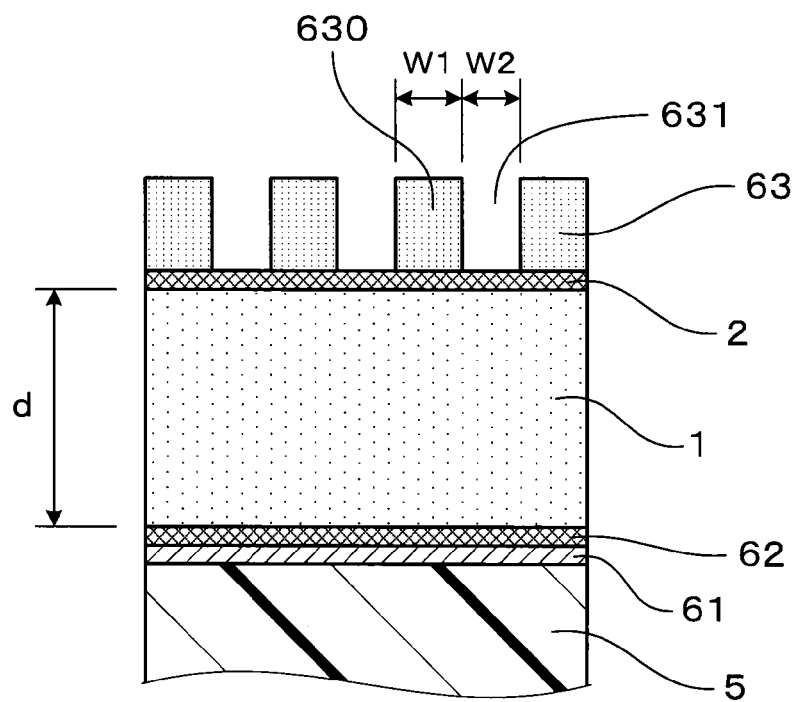
FIG. 2 is a cross-sectional view that follows FIG. 1.
Figure 3:
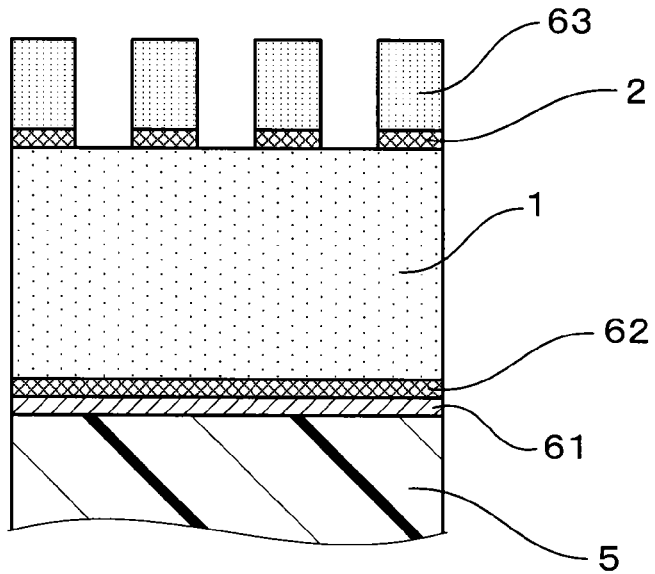
FIG. 3 is a cross-sectional view that follows FIG. 2.
Figure 4:
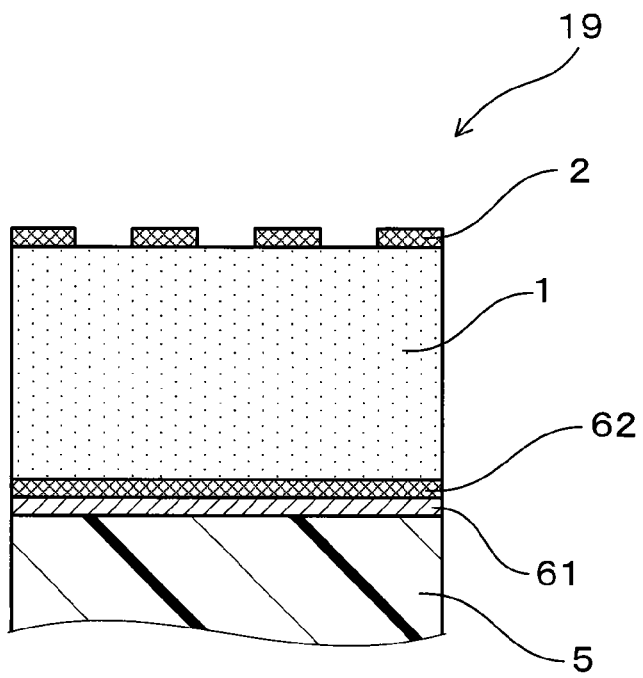
FIG. 4 is a cross-sectional view that follows FIG. 3.

After successively depositing the layers from the seed layer 61 to the photoresist 63 on the substrate 5, an exposure and development process is performed to pattern the photoresist 63 as shown in FIG. 2. Thereafter, as shown in FIG. 3, the hard mask layer 2 is dry-etched. Then, as shown in FIG. 4, the photoresist 63 is stripped. Through the above steps, an object-to-be-processed 19 is manufactured in which the surface of the organic film 1 is selectively protected by the hard mask layer 2.

Figure 5:
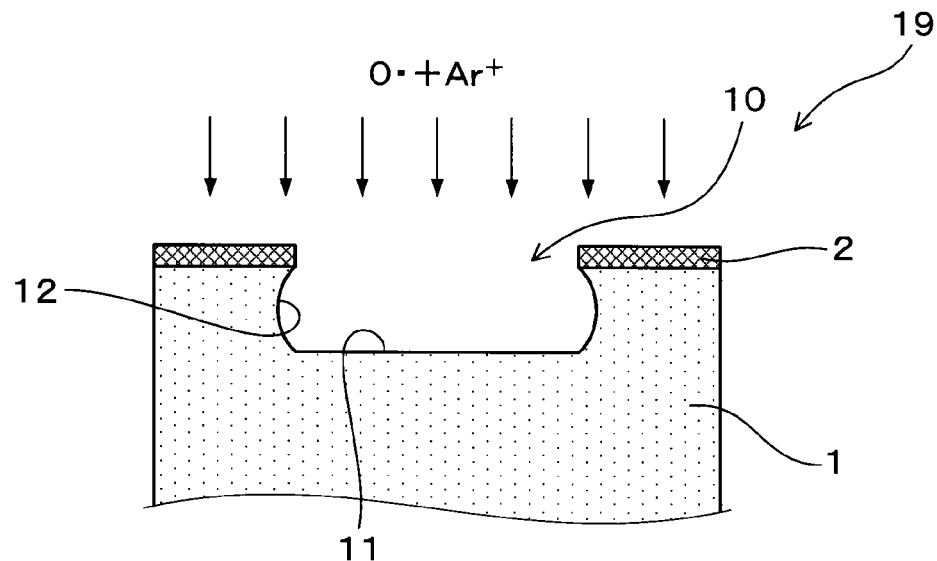
FIG. 5 is a major part enlarged view that follows FIG. 4, illustrating a partial etching process.

Thereafter, as shown in FIG. 5, the partial etching process is performed. As described above, the partial etching process uses a mixed gas containing a gas that anisotropically etches a silicon oxide film and a gas that isotropically etches the organic film 1 without etching the silicon oxide film. In the present example, $O_2$ gas is used as the gas for isotropic etching, and Ar gas is used as the gas for anisotropic etching. In the partial etching process, reactive ion etching (RIE) is performed. That is, in a chamber, an electromagnetic wave is applied to the mixed gas, thereby dissolving $O_2$ in the mixed gas to generate oxygen radicals, and ionizing Ar in the mixed gas to generate $Ar^+$. The oxygen radicals chemically react with the organic film 1, whereby the organic film 1 is isotropically etched. When the oxygen radicals are generated, oxygen ions are simultaneously generated, and the silicon oxide film might be etched by the oxygen ions. However, since the amount of the oxygen ions is negligible, no serious problem occurs. In the partial etching process, the organic film 1 is only etched partly in a direction of its thickness d (refer to FIG. 2). The $Ar^+$ activates the surface of the organic film 1 to promote the chemical reaction between the organic film 1 and the oxygen radicals. In addition, the organic film 1 is physically etched also by the $Ar^+$.

The partial etching process is followed by the deposition process as shown in FIG. 6. In this step, the protective film 3 made of a silicon oxide film is formed on the bottom surface 11 and the side surfaces 12 of the recess 10 formed in the partial etching process. At this time, the protective film 3 is deposited also on the hard mask layer 2. In the present example, the silicon oxide film is grown by chemical vapor deposition (CVD) using a material gas containing $O_2$ and TMS (tetramethylsilane). In the deposition process, O and Si, which have been converted into plasma in the chamber, are bound to each other on the surface of the object-to-be-processed 19, whereby the silicon oxide film is deposited. Since the CVD is performed without applying an electric field in the chamber, the reaction isotropically occurs. Therefore, the protective film 3 made of the silicon oxide film is formed on the bottom surface 11, the side surfaces 12, and the hard mask layer 2.

After the deposition process has been done, the partial etching process is again performed as shown in FIGS. 7 to 9. As described above, in the partial etching process, RIE is performed using the mixed gas containing the gas (Ar gas) that anisotropically etches the silicon oxide film and the gas ($O_2$ gas) that isotropically etches the organic film 1. That is, an electromagnetic wave is applied to the mixed gas in the chamber, thereby generating $Ar^+$ and oxygen radicals, and generating an electric field in the chamber. Then, as shown in FIG. 7, the $Ar^+$ is accelerated in the thickness direction (Z direction) by the electric field, and collided with the protective film 3. Thereby, as shown in FIG. 8, the protective films 3 formed on the side surfaces 12 are not largely etched, but the protective films 3 formed on the bottom surface 11 and on the hard mask layer 2 are mainly etched. Thereby, the organic film 1 is exposed at the bottom surface 11.

By continuing the partial etching process, as shown in FIGS. 8 and 9, the bottom surface 11 in the recess 10 is isotropically etched by the oxygen radicals. At this time, the side surfaces 121 of the portion etched in the last partial etching process (refer to FIG. 5) are protected by the protective films 3, and therefore, are not etched. At the side surfaces 122 of the portion to be newly etched, etching advances also in the X direction (direction perpendicular to the Z direction). However, by appropriately controlling the amount of etching in the Z direction in one partial etching process, the amount of etching at the side surfaces 122 in the X direction can be made negligible.

Figure 10:
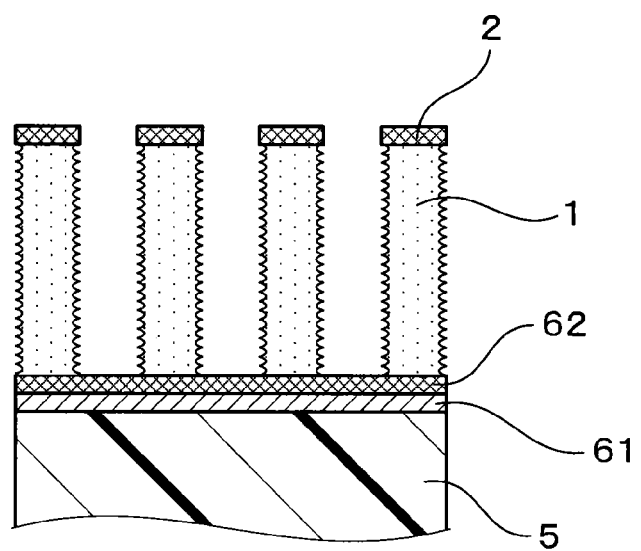
FIG. 10 is a cross-sectional view after the partial etching process and the deposition process have been alternately performed multiple times in Example 1.

In the present example, the partial etching process (refer to FIGS. 8 and 9) and the deposition process (refer to FIG. 6) are alternately performed multiple times. In this way, the side surfaces 121 of the portion already etched can be protected by the protective film 3 formed in the deposition process, and the side surfaces 122 of the portion to be newly etched are prevented from being largely etched in the X direction. Therefore, as shown in FIG. 10, by repeating the two processes, the pattern of the hard mask layer 2 can be accurately transferred onto the organic film 1. Since the etching rate of the organic film 1 etched by the oxygen radicals is high, even when the deposition process and the partial etching process are alternately performed, the etching rate throughout the whole process can be made sufficiently high.

Figure 11:
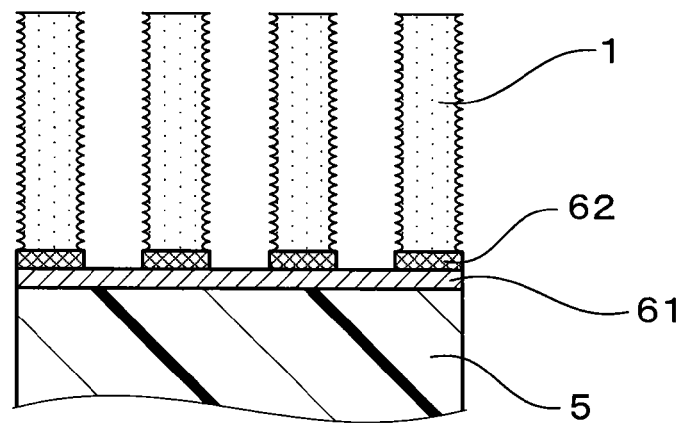
FIG. 11 is a cross-sectional view that follows FIG. 10.

After the etching of the organic film 1 has been completed, as shown in FIG. 11, wet etching is performed to remove the hard mask layer 2 and the seed protective layer 62. This process may be performed by dry etching using $CF_4$ gas or the like.

Figure 13:
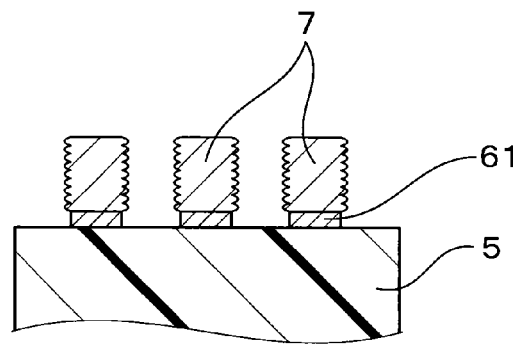
FIG. 13 is a cross-sectional view that follows FIG. 12.

After the removal of the hard mask layer 2 and the seed protective layer 62, as shown in FIG. 12, a plating process is performed to grow the wiring layer 7 on the exposed seed layer 61. After the plating process has been completed, as shown in FIG. 13, the organic film 1 is stripped, and further, the seed protective layer 62 and the seed layer 61 are etched. Thus, the intended wiring layer 7 is formed.

The functions and effects of the present example will be described. In the present example, the partial etching process (refer to FIGS. 7 to 9) and the deposition process (refer to FIG. 6) are alternately performed multiple times. Therefore, the pattern of the hard mask layer 2 can be accurately transferred onto the organic film 1, and the etching rate can be increased.

That is, since the mixed gas contains the gas that anisotropically etches the silicon oxide film (protective film 3), when the partial etching process is performed using the mixed gas, the protective films 3 formed on the side surfaces 12 in the last deposition process are not largely etched, but the protective film 3 formed on the bottom surface 11 is mainly etched, whereby the organic film 1 at the bottom surface 11 can be exposed. Thereafter, by continuing the partial etching process, the organic film 1 exposed at the bottom surface 11 can be etched by the gas contained in the mixed gas and isotropically etches the organic film 1.

By alternately repeating the partial etching process and the deposition process, the organic film 1 can be etched in the Z direction while the side surfaces 12 are protected by the protective film 3. Further, at the portion of the organic film 1, which is to be newly etched by the isotropic etching gas, etching also advances on the side surfaces 122 thereof (refer to FIG. 9). However, by appropriately controlling the amount of etching in the Z direction in a single partial etching process, the amount of etching on the side surfaces 122 in the X direction can be made negligible. Thereby, the anisotropy of the etching can be enhanced, and the pattern of the hard mask layer 2 can be accurately transferred onto the organic film 1. Since the etching rate of the isotropic etching gas ($O_2$) is high, even when the partial etching process and the deposition process are alternately performed, the etching rate throughout the whole process can be made relatively high.

Figure 26:
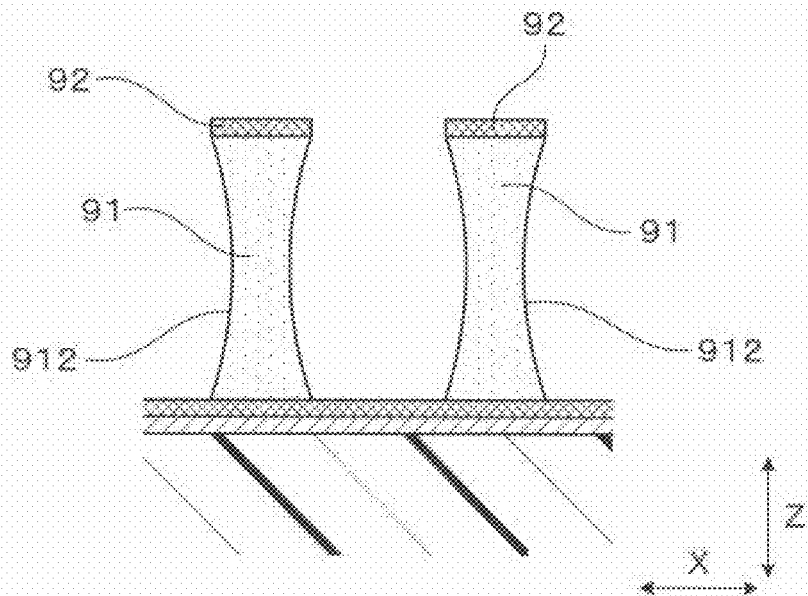
FIG. 26 is a cross-sectional view of an organic film in Comparative Example.

It is now assumed that an organic film is etched by performing only the isotropic etching process without alternately performing the partial etching process and the deposition process. In this case, as shown in FIG. 26, side surfaces 912 of the organic film 91 are largely etched in the X direction. Accordingly, the larger the thickness (the dimension in the Z direction) of the organic film 91 to be etched, the higher the likelihood of degradation in transfer accuracy of the pattern of a hard mask layer 92 onto the organic film 91. In addition, there is a possibility that the organic film 91 falls down. However, if the partial etching process and the deposition process are alternately performed as in the present example, the organic film 1 is etched while the side surfaces 12 (refer to FIGS. 7 to 9) are protected by the protective film 3, and thus the above problem is not likely to occur.

The etching method of the present example is particularly effective when the organic film 1 is thick and accurate pattern transfer is desired. In the present example, as described above, the substrate 5 has a large height difference, and this difference needs to be buried with the organic film 1, and therefore, the thickness of the organic film 1 is partially increased. Even in such a situation, since the present example provides the high etching rate, etching of the organic film 1 can be completed in a short time. In addition, since the pattern transfer is accurately performed, the wiring layer 7 (refer to FIG. 13) can be easily miniaturized.

The mixed gas of the present example contains $O_2$ gas and Ar gas. During the partial etching process (refer to FIGS. 7 to 9), oxygen radicals and $Ar^+$ are generated, and the protective film 3 is anisotropically etched by the $Ar^+$ while the organic film 1 is isotropically etched by the oxygen radicals.

When the $Ar^+$ converted from the Ar gas is applied to the organic film, the $Ar^+$ activates the organic film at the bottom surface to enhance the reactivity. Therefore, by using the Ar gas in combination with the $O_2$ gas, the etching rate of the organic film etched by the oxygen radicals can be further increased.

While in the present example $O_2$ gas is used as the isotropic etching gas, $N_2$ gas may be used. However, in terms of the etching rate, $O_2$ gas is most suitable. Alternatively, a mixed gas containing $O_2$ gas and $N_2$ gas may be used. In this case, the higher the ratio of the $O_2$ gas, the more advantageous the mixed gas is in terms of the etching rate.

As described above, according to the present example, it is possible to provide an organic film etching method which allows accurate transfer of the pattern of the hard mask layer, and has a high etching rate.

While in the present example a gas obtained by mixing $O_2$ gas and TMS (tetramethylsilane) is employed as the material gas in the deposition process, the present invention is not limited thereto. Instead of TMS, other organic Si gases such as tetramethoxysilane (TMOS), methyltrimethoxysilane (MTMOS), dimethyldimethoxysilane (DMDMOS), and methoxymethylsilane (MOTMS) may be used.

While in the present example Ar gas is employed as the gas that anisotropically etches the silicon oxide film, other rare gases such as Kr and Xe may be employed. However, since Ar gas is inexpensively available among rare gases, it is preferable to use Ar gas.

The above-mentioned "silicon oxide film" is not limited to $SiO_2$, and a silicon oxide film in which the composition ratio of Si and O slightly deviates from 1:2 is also included in the "silicon oxide film". For example, depending on the deposition condition of CVD, it is possible to deposit a silicon oxide film in which the composition ratio of Si and O slightly deviates from 1:2.

Example 2

Figure 14:
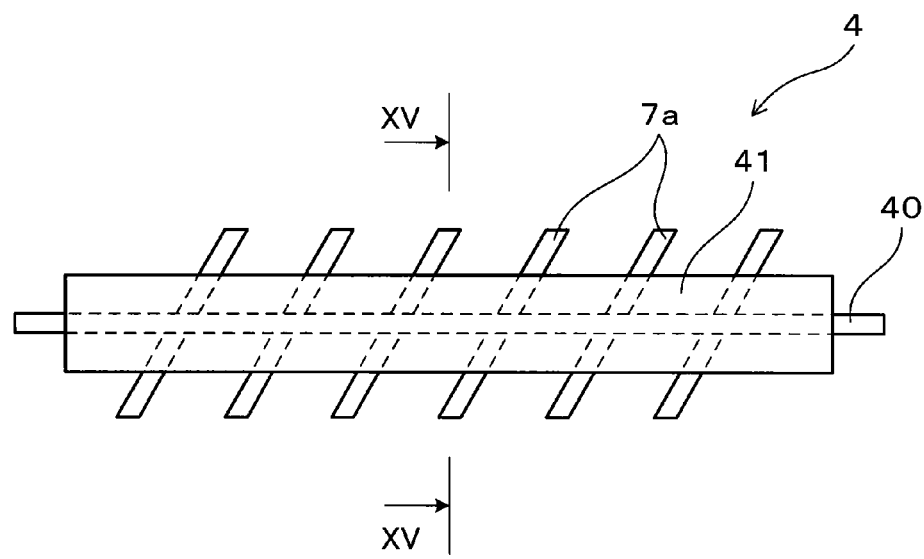
FIG. 14 is a top view illustrating an MI sensor manufacturing method in Example 2.
Figure 15:
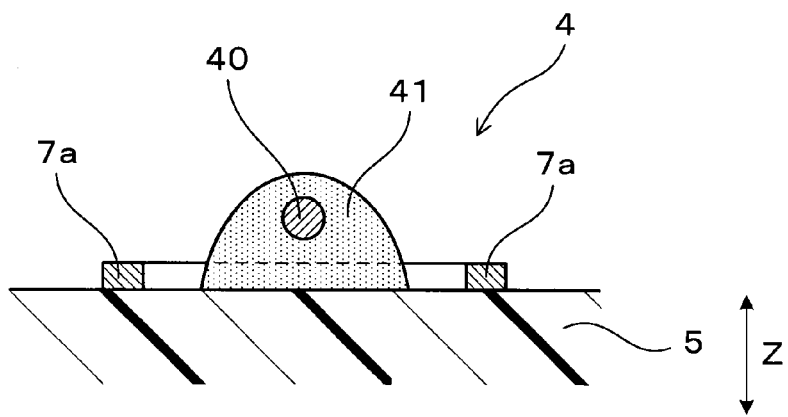
FIG. 15 is a cross-sectional view taken along a line XV-XV in FIG. 14.

Example 2 is one example to form a detection coil 79 to be wound around an amorphous wire in an MI sensor 4 (Magneto-Impedance Sensor) by employing the above-mentioned method for etching the organic film 1. As shown in FIGS. 14 and 15, in manufacturing the MI sensor 4, first, a first wiring layer 7a is formed on a substrate 5 made of silicon, and a holding member 41 made of resin is applied thereon to hold a linear magneto-sensitive body 40. Thereafter, the holding member 41 is cured with heat. The first wiring layer 7a can be formed by using a well-known plating process.

Figure 16:
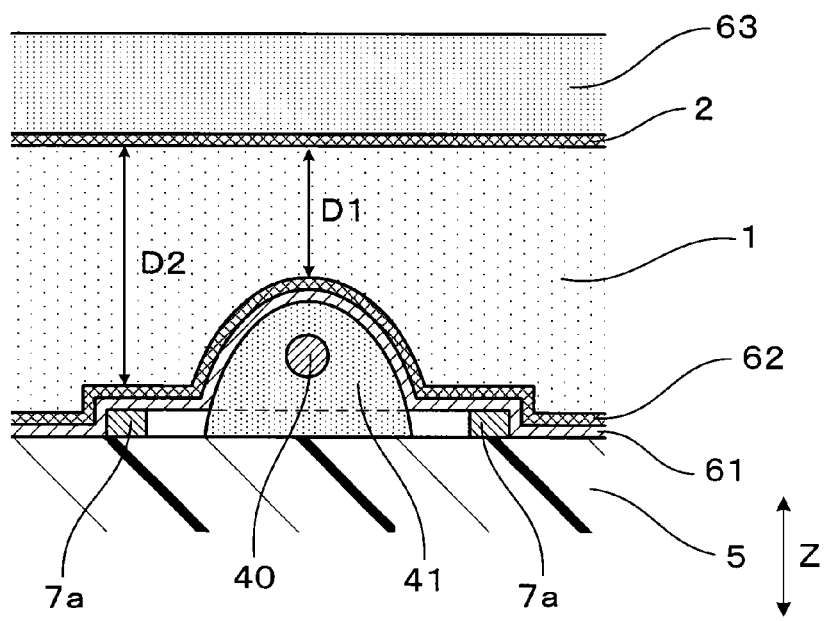
FIG. 16 is a cross-sectional view that follows FIG. 15.

Thereafter, as shown in FIG. 16, a seed layer 61, a seed protective layer 62, an organic film 1 (plating resist), a hard mask layer 2, and a photoresist 63 are deposited in order. The materials and the like of these layers f are identical to those of Example 1.

Thereafter, an exposure and development process (refer to FIG. 2), a dry-etching process (refer to FIG. 3), and a resist stripping process (refer to FIG. 4) are successively performed in a similar manner to that for Example 1, and furthermore, a partial etching process (refer to FIGS. 7 to 9) and a deposition process (refer to FIG. 6) are alternately performed multiple times.

In the present example, as shown in FIG. 16, a large height difference is formed by the magneto-sensitive body 40 and the holding member 41. Since this difference needs to be buried by using the organic film 1, the thickness of the organic film 1 has to be increased. In addition, the organic film 1 has a thin portion D1 and a thick portion D2. Therefore, even if it is attempted to form the organic film 1 made of a photosensitive resist and directly expose the photosensitive resist by using an exposure device, the exposure device cannot focus on the resist. Therefore, it is necessary to once expose the photoresist 63, etch the hard mask layer 2 (refer to FIG. 3), and transfer the pattern of the hard mask layer 2 onto the organic film 1.

Figure 17:
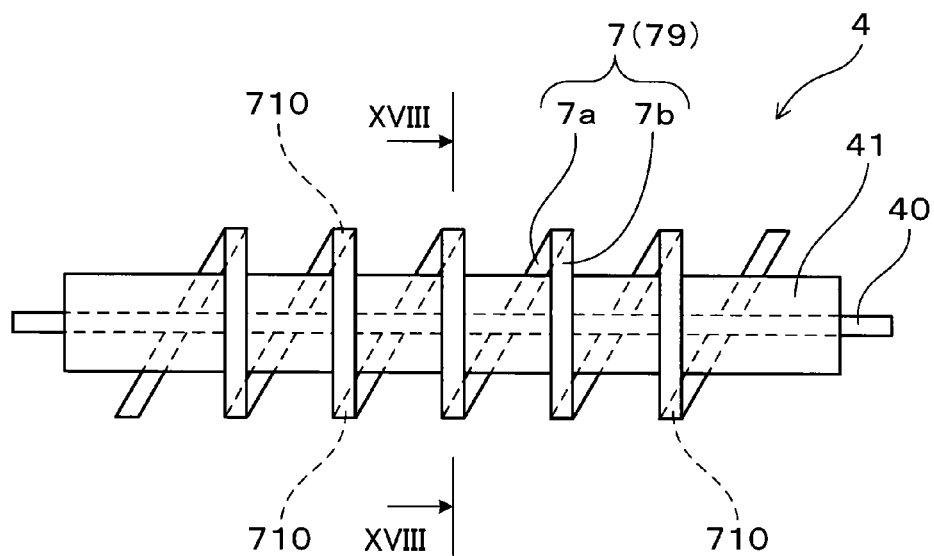
FIG. 17 is a top view that follows FIG. 16, illustrating the MI sensor.
Figure 18:
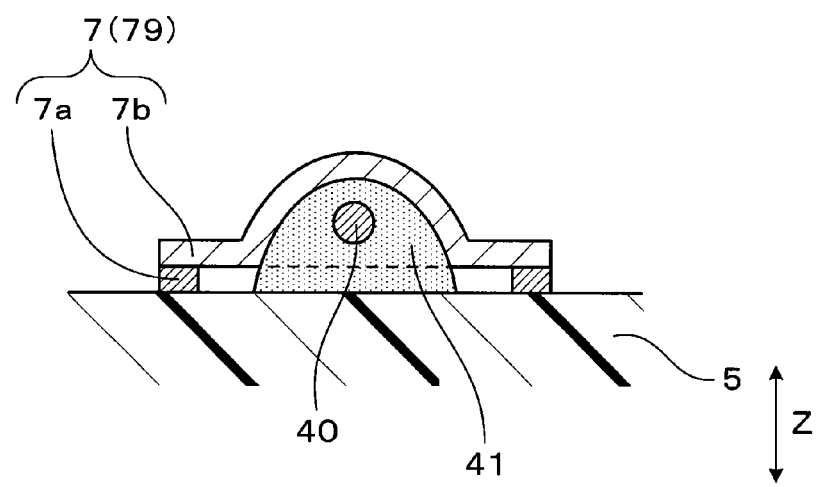
FIG. 18 is a cross-sectional view taken along a line XVIII-XVIII in FIG. 17.

After the entire organic film 1 has been etched throughout by alternately performing the partial etching process and the deposition process, a plating process is performed (refer to FIGS. 12 and 13). Thereby, as shown in FIGS. 17 and 18, a second wiring layer 7b is formed by plating. The second wiring layer 7b is formed extending over the magneto-sensitive body 40 and the holding member 41. The second wiring layer 7b is connected to both ends 710 of the first wiring layer 7a. The first wiring layer 7a and the second wiring layer 7b form the detection coil 79.

The functions and effects of the present example will be described. The organic film 1 of the present example is a plating resist for forming the wiring layer 7 (second wiring layer 7b) having a height difference in the Z direction.

In order to form the wiring layer 7 having a height difference in the Z direction by plating, a thick plating resist (organic film 1) needs to be used. In this case, when the above-mentioned etching method is used, since the etching rate is high, even the thick plating resist (organic film 1) can be etched in a short time. If the width, the pattern interval, or the like of the wiring is reduced, a problem such as short-circuit or disconnection easily occurs, which may make formation of the wiring difficult. However, since the above-mentioned etching method allows accurate transfer of the pattern, the wiring layer 7 can be more miniaturized as compared to the conventional method.

In the present example, the wiring layer 7 (second wiring layer 7b) forms the detection coil 79 of the MI sensor.

The wiring layer 7 (second wiring layer 7b) forming the detection coil 79 of the MI sensor 4 needs to extend over a large protrusion formed by the magneto-sensitive body 40 and the holding member 41. Therefore, in order to bury a height difference formed by this protrusion, the plating resist (organic film 1) for forming the detection coil 79 is particularly required to be thick. In recent years, with an increase in demands for size reduction and high sensitivity of the MI sensor 4, the necessity of miniaturizing the pattern of the detection coil 79 as described above has been increased. Since the plating resist for forming the detection coil 79 needs to be thick and the pattern of the detection coil 79 needs to be miniaturized as described above, a great effect is achieved when a method that has a high etching rate and allows accurate transfer of the pattern of the hard mask layer 2, like the above-mentioned etching method, is employed.

Other components, functions, and effects of Example 2 are identical to those of Example 1.

Example 3

Figure 19:
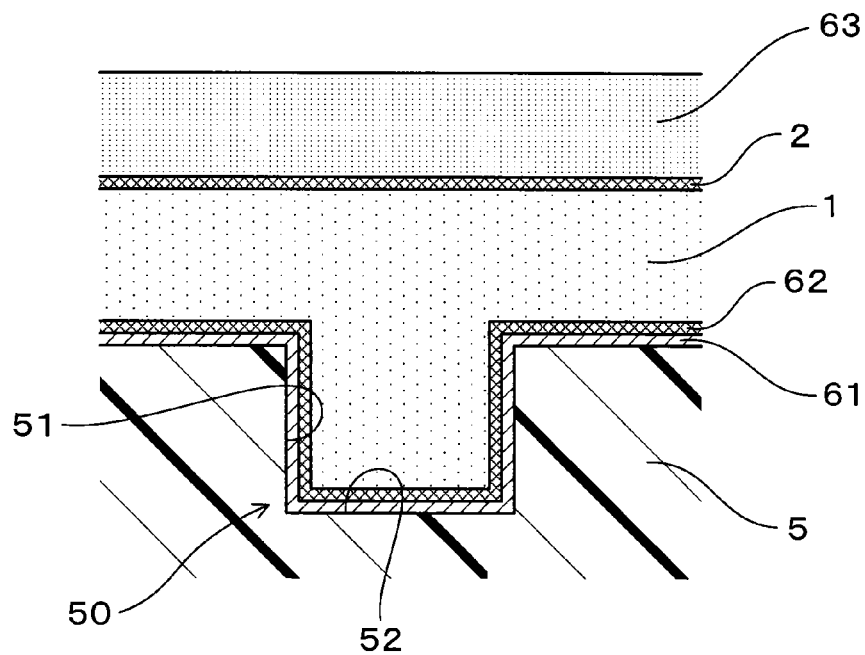
FIG. 19 is a cross-sectional view illustrating an MI sensor manufacturing method in Example 3.

Example 3 relates to a modification of the shape of the MI sensor 4. In manufacturing the MI sensor 4 of the present example is manufactured, as shown in FIG. 19, first, a groove 50 is formed in a substrate 5, and a seed layer 61 and a seed protective layer 62 are deposited. At this time, the seed layer 61 and the seed protective layer 62 are deposited also on side surfaces 51 and a bottom surface 52 of the groove 50. Subsequently, an organic film 1 (plating resist), a hard mask layer 2, and a photoresist 63 are deposited.

Figure 20:
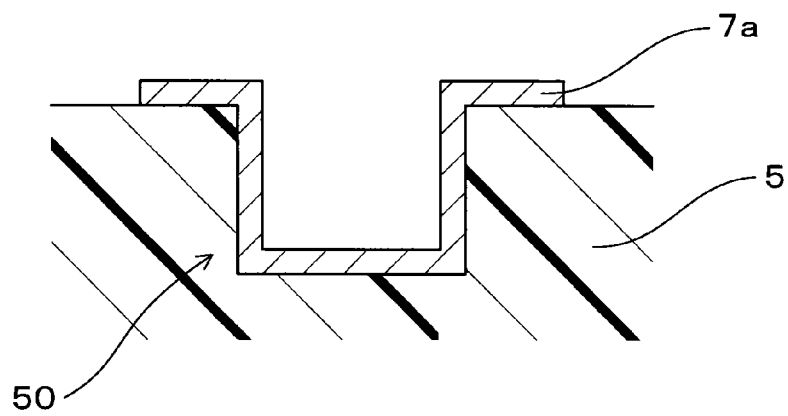
FIG. 20 is a cross-sectional view that follows FIG. 19.
Figure 21:
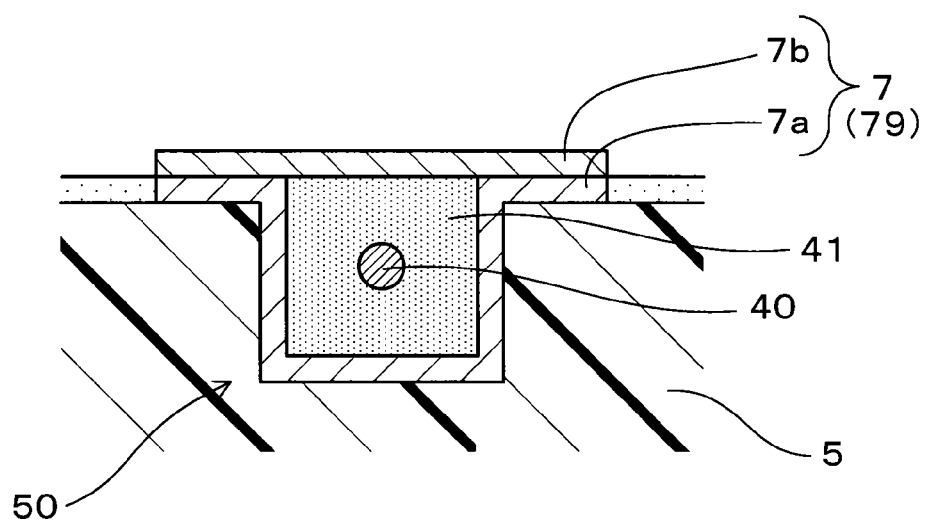
FIG. 21 is a cross-sectional view that follows FIG. 20.

Thereafter, as in Example 2, an exposure and development process (refer to FIG. 2), a dry etching process (refer to FIG. 3), and a resist stripping process (refer to FIG. 4) are successively performed. Further, a partial etching process (refer to FIGS. 7 to 9) and a deposition process (refer to FIG. 6) are alternately performed multiple times to etch the organic film 1 in the Z direction. Thereafter, a plating process (refer to FIGS. 12 and 13) is performed to form a first wiring layer 7a by plating as shown in FIG. 20. Thereafter, as shown in FIG. 21, a magneto-sensitive body 40 is disposed in the groove 50, and the groove 50 is filled with a holding member 41 made of resin. Thereafter, a second wiring layer 7b is formed. The second wiring layer 7b can be formed by using a well-known plating method. The first wiring layer 7a and the second wiring layer 7b form a detection coil 79.

In the present example, as shown in FIGS. 19 and 20, when the first wiring layer 7a of the detection coil 79 is formed, the groove 50 needs to be filled with the organic film 1 (plating resist). Therefore, the organic film 1 needs to be thick. Further, in order to meet the recent demands for high sensitivity of the MI sensor 4, it is necessary to miniaturize the pattern of the detection coil 79 by, for example, reducing the width or the pattern interval of the wiring layer 7 constituting the detection coil 79. Therefore, a great effect is achieved when a method that has a high etching rate of the organic film 1 and allows accurate pattern transfer, like the above-mentioned etching method, is used.

Experimental Example 1

An experiment for confirming the effects of the present invention was conducted. First, on a substrate 5 made of silicon (refer to FIG. 1), a seed layer 61 made of Cu, a seed protective layer 62 made of $SiO_2$, an organic film 1 made of an epoxy resin, a hard mask layer 2 made of $SiO_2$, and a photoresist 63 were laminated in this order. A Ti thin film was interposed between the respective layers (except for a position directly beneath the photoresist 63) to enhance adhesion. As the organic film 1, THB-126N manufactured by JSR Corporation was adopted. The thickness of the organic film 1 was 40 μm. As the photoresist 63, TMMR P-W1000PM manufactured by Tokyo Ohka Kogyo Co., Ltd. was used. The thickness of the photoresist 63 was 4 μm. The thicknesses of the seed protective layer 62 and the hard mask layer 2 were each 0.5 μm.

After the above-mentioned process, an exposure and development process (refer to FIG. 2) was performed to form an etching pattern so that the width W1 of each remaining portion 630 and the width W2 of each space 631 were each 5.0 μm. Thereafter, a dry etching process using $CF_4$ gas was performed to etch the hard mask layer 2 (refer to FIG. 3), and the photoresist 63 was stripped (refer to FIG. 4). Through the above-mentioned processes, an object-to-be-processed 19 was manufactured.

Figure 22:
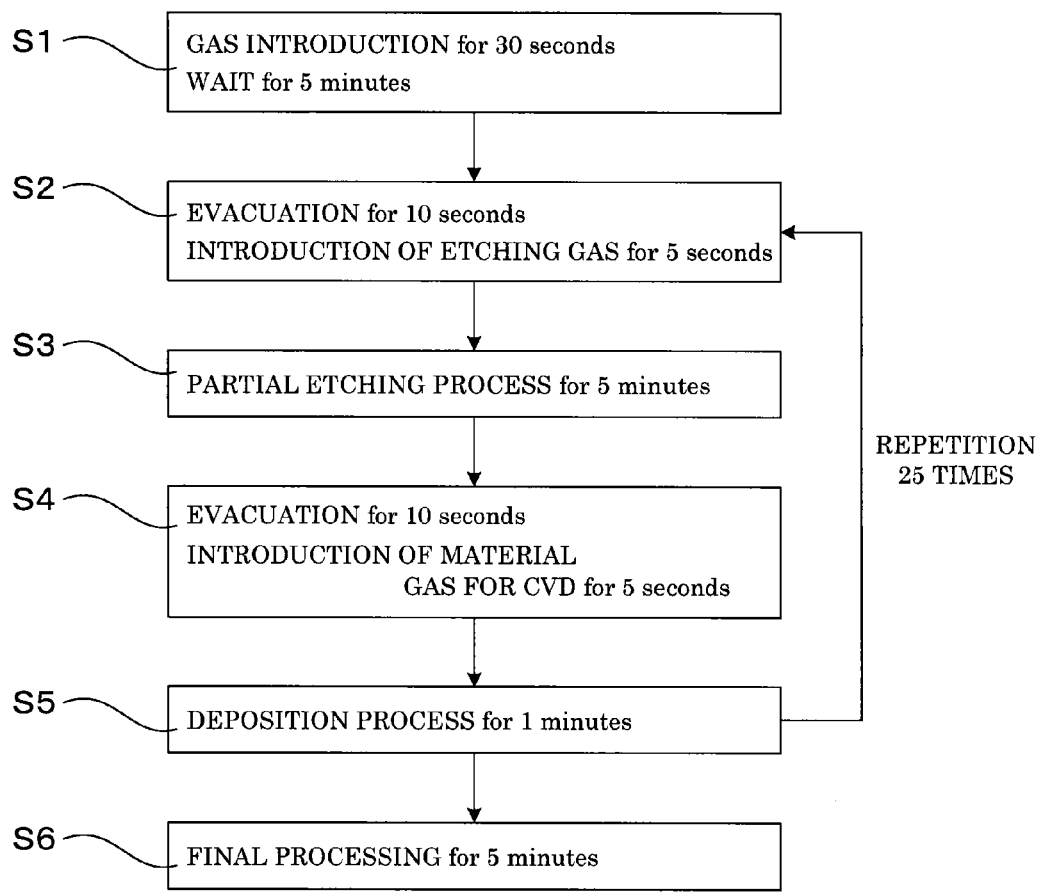
FIG. 22 is a flowchart in Experimental Example 1.

Thereafter, a partial etching process (refer to FIGS. 7 to 9) and a deposition process (refer to FIG. 6) were alternately performed, thereby performing a process of etching the organic film 1 in the Z direction. As an etching device, Plasmalab System 100 manufactured by Oxford Instruments was used. In the etching step, as shown in FIG. 22, first, $O_2$ gas and Ar gas were introduced in a chamber, and the etching device waited for five minutes to stabilize the substrate temperature (step S1). Thereafter, the chamber was evacuated, and a gas for etching was introduced (step S2). In this step, after $O_2$ gas was introduced into the chamber at a rate of $3.38\times10^{-2}$ m$^3$/s, Ar gas was introduced into the chamber at a rate of $3.38\times10^{-2}$ m$^3$/s. The $O_2$ gas and the Ar gas were mixed with each other in the chamber.

Next, a partial etching process was performed (step S3). In the partial etching process, the air pressure in the chamber was set at 0.266 Pa, and the temperature of the object-to-be-processed 19 was set at 25±10° C.

After the partial etching process, the chamber was evacuated, and a material gas of a protective film 3 was introduced (step S4). In this step, $O_2$ gas was introduced into the chamber at a rate of $1.35\times10^{-2}$ m$^3$/s, and thereafter, TMS (tetramethylsilane) was introduced into the chamber at a rate of 3.38× 10⁻³ m³/s. Step S4 was followed by a deposition process (step S5). In the deposition step, the air pressure in the chamber was set at 0.266 Pa, and the temperature of the object-to-be-processed 19 was set at 25±10° C. Then, the protective film 3 was deposited in the thickness of 10 nm.

After the steps S2 to S5 had been repeated twenty-five times, a final process (step S6) was performed. The etching rate throughout the whole process, including the deposition process (step S5), was 0.43 μm/min. It was confirmed that this etching rate was not greatly different from an etching rate (0.47 μm/min) obtained in a comparative experiment described later.

When etching is performed using a mixed gas of CH-based gas and NH₃ gas as in the conventional art, the etching rate is 0.15 μm/min. It is found that, in comparison with this value, the present invention can significantly improve the etching rate (0.43 μm/min).

Figure 23:
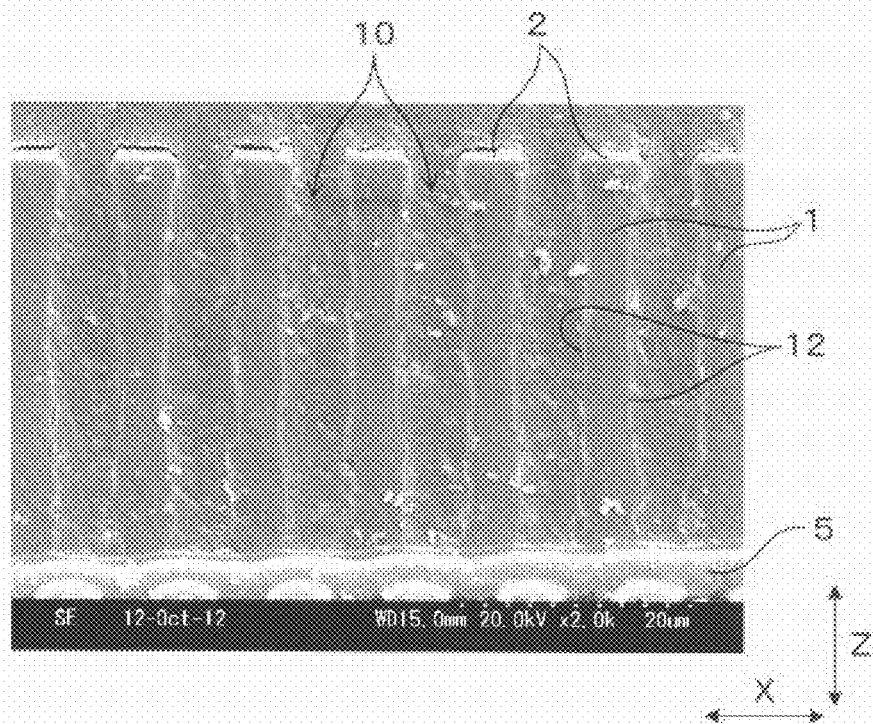
FIG. 23 is a SEM picture of a section of an etched organic film in Experimental Example 1.

FIG. 23 shows a SEM picture of a cross section of the organic film 1 has been entirely etched. It is found from this picture that each side surface 12 of the organic film 1 is not largely etched in the X direction and the pattern of the photoresist 63 is accurately transferred. The maximum width of the recess 10 is 5.7 μm, and the pattern conversion error is 14%.

Comparative Experiment

Figure 24:
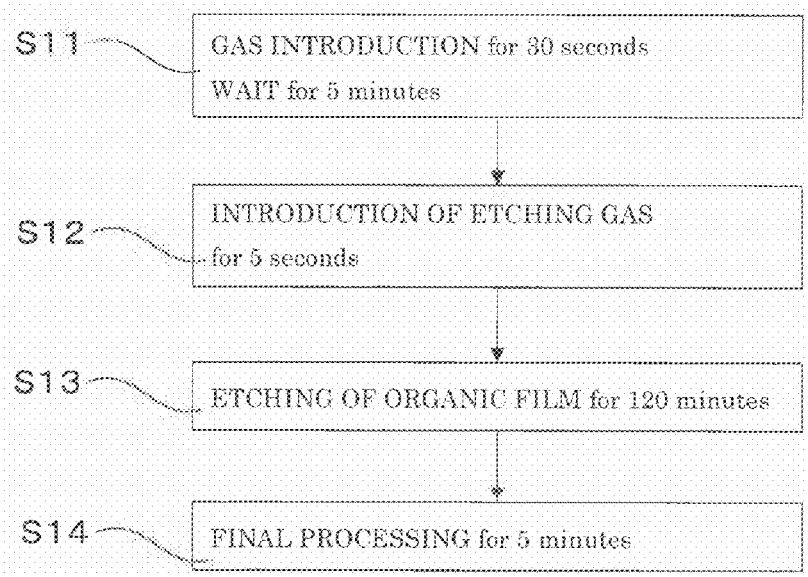
FIG. 24 is a flowchart in Comparative Experiment.

A comparative experiment, which is not included in the present invention, was performed. First, an object-to-be processed 19 identical to that of Experimental Example 1 was manufactured. Then, etching was solely performed without a protective film (refer to FIG. 6) being formed, thereby to etch the entire organic film. That is, as shown in FIG. 24, after introduction of the gas into the chamber, the etching device waited for five minutes (step S11), and thereafter, the etching gas was introduced into the chamber (step S12). In this step, O₂ gas was introduced at a rate of 3.38×10⁻² m³/s, and then Ar gas was introduced at a rate of 3.38×10⁻² m³/s.

Next, etching of the organic film was performed (step S13). In this step, the air pressure in the chamber was set at 0.266 Pa, and the temperature of the object-to-be-processed 19 was set at 25±10° C. Then, the entire organic film was etched in the Z direction by a single etching process without a protective film being formed.

Figure 25:
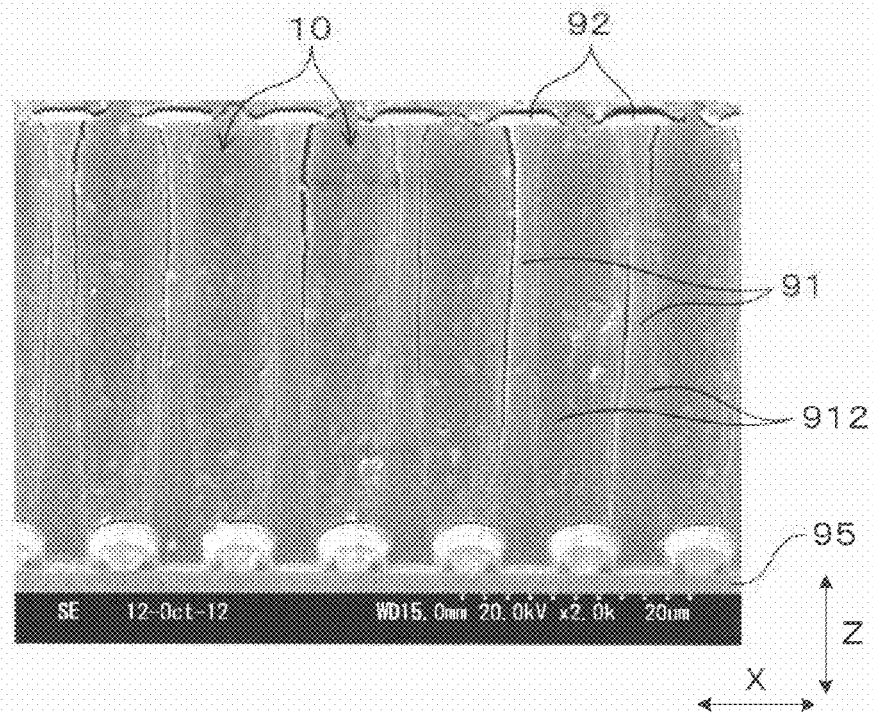
FIG. 25 is a SEM picture of a section of an etched organic film in Comparative Experiment.

The etching rate of the organic film was 0.47 μm/min. FIG. 25 shows a SEM picture of a cross section of the organic film after etched. It is found from this picture that each side surface 912 of the organic film 91 is largely etched in the X direction and the pattern of the photoresist 63 is not accurately transferred. The maximum width of the recess 10 is 8.3 μm, and the pattern conversion error is 66%. Thus, it is found that the pattern transfer error is greater in the comparative experiment than in Example 1.

DESCRIPTION OF THE REFERENCE CHARACTERS

1 organic film
10 recess
11 bottom surface
12 side surface
2 hard mask layer
3 protective film

What is claimed is:

1. A method for etching an organic film having a surface selectively protected by a hard mask layer, the method comprising:
   a) partially etching the organic film in a thickness direction thereof with a mixed gas comprising a gas that anisotropically etches a silicon oxide film and a gas that isotropically etches the organic film without etching the silicon oxide film to form a partially etched organic film; and
   b) depositing a protective film made of the silicon oxide film on side surfaces and a bottom surface of a recess formed in a) in the partially etched organic film,
   wherein a) and b) are each performed multiple times.

2. The method according to claim 1,
   wherein the mixed gas comprises O₂ gas and Ar gas, and Ar⁺ and oxygen radicals are generated from the mixed gas in the partial etching, and
   wherein the Ar⁺ anisotropically etches the silicon oxide film, and the oxygen radicals isotropically etch the organic film.

3. The method according to claim 1,
   wherein the organic film is a plating resist for forming a wiring layer having a height difference in the thickness direction of the organic film.

4. The method according to claim 3,
   wherein the wiring layer forms a coil that winds around a magneto-sensitive body provided on a substrate in an MI sensor, and
   wherein the organic film is a plating resist for forming the coil.

5. The method according to claim 2,
   wherein the organic film is a plating resist for forming a wiring layer having a height difference in the thickness direction of the organic film.

6. The method according to claim 5,
   wherein the wiring layer forms a coil that winds around a magneto-sensitive body provided on a substrate in an MI sensor, and
   wherein the organic film is a plating resist for forming the coil.

* * * * *